United States Patent
Kalkschmidt et al.

(10) Patent No.: US 9,750,109 B2
(45) Date of Patent: Aug. 29, 2017

(54) DETECTION OF A HAZARD CONDITION OF A LOAD

(71) Applicant: OLEDWORKS GMBH, Aachen (DE)

(72) Inventors: Christian Kalkschmidt, Aachen (DE); Jan-Rene Luetz, Moenchengladbach (DE)

(73) Assignee: OLEDWORKS GMBH, Aachen (DE)

( * ) Notice: Subject to any disclaimer, the term of this patent is extended or adjusted under 35 U.S.C. 154(b) by 0 days.

(21) Appl. No.: 14/770,124

(22) PCT Filed: Feb. 25, 2014

(86) PCT No.: PCT/IB2014/059230
§ 371 (c)(1),
(2) Date: Aug. 25, 2015

(87) PCT Pub. No.: WO2014/132188
PCT Pub. Date: Sep. 4, 2014

(65) Prior Publication Data
US 2016/0007415 A1    Jan. 7, 2016

Related U.S. Application Data

(60) Provisional application No. 61/769,787, filed on Feb. 27, 2013.

(51) Int. Cl.
*H05B 33/06* (2006.01)
*G01R 31/02* (2006.01)
(Continued)

(52) U.S. Cl.
CPC ......... *H05B 33/089* (2013.01); *G01R 31/025* (2013.01); *H02H 3/10* (2013.01);
(Continued)

(58) Field of Classification Search
CPC ...... H05B 37/02; H05B 33/08; H05B 33/089; H05B 33/0803; H05B 33/0842;
(Continued)

(56) References Cited

U.S. PATENT DOCUMENTS

| 2011/0115405 A1* | 5/2011 | Guo ................. H05B 33/089 315/294 |
| 2011/0169423 A1 | 7/2011 | Huang et al. |

(Continued)

FOREIGN PATENT DOCUMENTS

| DE | 1538376 A1 | 7/1969 |
| EP | 2456057 A2 | 5/2012 |

(Continued)

OTHER PUBLICATIONS

Contadini, "Flexible Overvolgate/Undervolgate Detector Monitors Negative and Positive Voltages", Dec. 2010, pp. 1-3, Retrieved From the Internet at http://www.maxim-ic.com/app-notes/indes.mvp/id/4545.

(Continued)

*Primary Examiner* — Thai Pham

(57) ABSTRACT

An electrical circuit is described for detection of an electrical hazard condition of a load 20, in particular of an OLED lighting element comprising driving terminals A, C. An electrical hazard condition, such as an overvoltage or short circuit is to be detected between terminals 22a, 22b of the circuit. A disabling element 24 is connected to one of the terminals 22a, 22b to disable the load. A monitoring circuit is connected to monitor a voltage V or current magnitude at at least one of the terminals 22a, 22b. The monitoring circuit comprises a maximum or minimum value detector 26 to deliver a maximum or minimum value $V_{max}$ of the voltage or current magnitude over time. The monitoring circuit is disposed to monitor the maximum or minimum value $V_{max}$ to detect the electrical hazard condition. A monitoring circuit (Continued)

is connected to activate the disabling element 24 if an electrical hazard condition is detected. The electrical circuit, a lighting arrangement including an LED or OLED lighting element and the electrical circuit, and a detection method allows to operate a load with different types of power supply, in particular also by PWM.

10 Claims, 3 Drawing Sheets

(51) Int. Cl.
*H02H 3/10* (2006.01)
*H05B 33/08* (2006.01)

(52) U.S. Cl.
CPC ..... *H05B 33/0803* (2013.01); *H05B 33/0842* (2013.01); *H05B 33/0896* (2013.01)

(58) Field of Classification Search
CPC .. H05B 33/0896; G01R 31/02; G01R 31/025; H02H 3/10
USPC .... 315/119, 121, 122, 125, 185 R, 192, 224, 315/291, 294, 307, 308
See application file for complete search history.

(56) References Cited

U.S. PATENT DOCUMENTS

| | | | |
|---|---|---|---|
| 2012/0074947 A1 | 3/2012 | Cortigiani et al. | |
| 2012/0104952 A1* | 5/2012 | Chen | H05B 33/083 315/122 |
| 2012/0176826 A1* | 7/2012 | Lazar | H02M 3/158 363/126 |
| 2012/0181931 A1 | 7/2012 | Katsura | |
| 2012/0235574 A1 | 9/2012 | Sumi et al. | |
| 2012/0274877 A1* | 11/2012 | Sasaki | G09G 3/3406 349/69 |

FOREIGN PATENT DOCUMENTS

| | | |
|---|---|---|
| EP | 2533608 A1 | 12/2012 |
| EP | 2549835 A2 | 1/2013 |
| JP | 2003174356 A | 6/2003 |
| WO | 2010035168 A1 | 4/2010 |

OTHER PUBLICATIONS

China Patent Office, Xu Xu, Letter and OA with References. Dec. 7, 2016, 69 pages.

\* cited by examiner

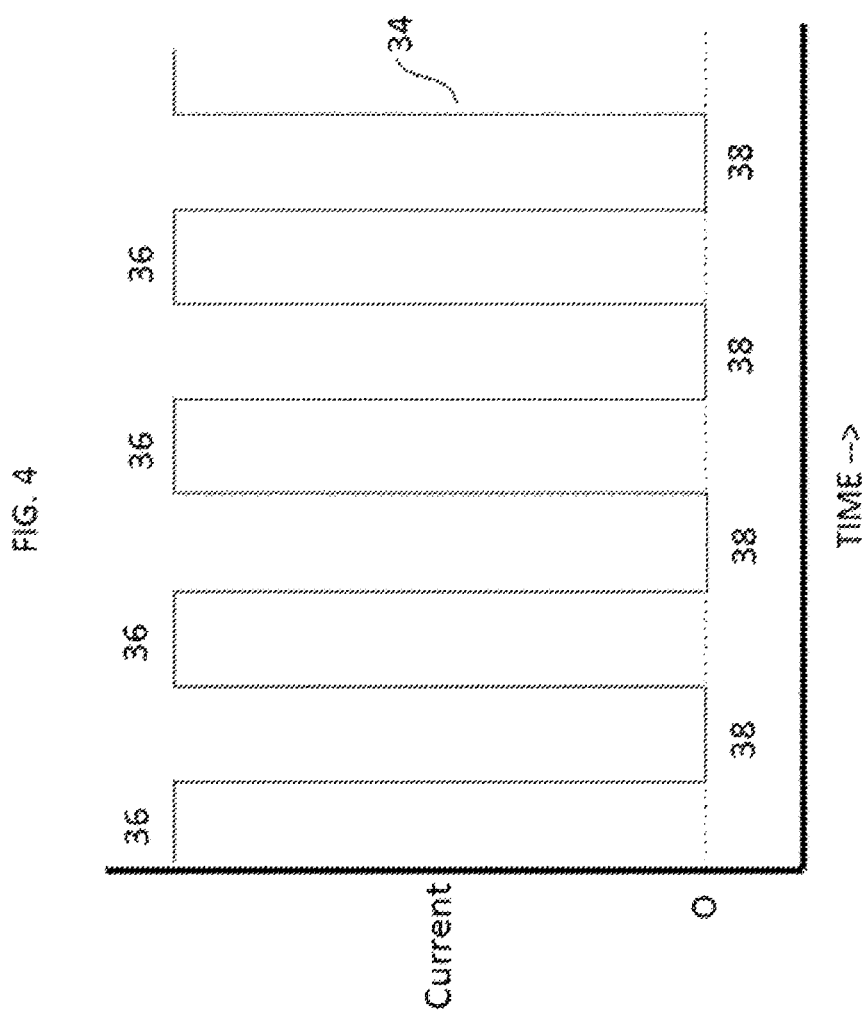

DETECTION OF A HAZARD CONDITION OF A LOAD

CROSS-REFERENCE TO PRIOR APPLICATIONS

This application is the U.S. National Phase application under 35 U.S.C. §371 of International Application No. PCT/IB2014/059230, filed on Feb. 25, 2014, which claims the benefit of U.S. Provisional Application 61/769,787, filed on Feb. 27, 2013. These applications are hereby incorporated by reference herein.

FIELD OF THE INVENTION

The invention relates to a method and to an electrical circuit for detection of a failure condition in the operation of an electrical load, and more specifically to an electrical circuit and to a method for the detection of an electrical hazard condition. Further, the invention relates to a lighting arrangement including an electrical circuit for detection of an electrical hazard condition and to a method of operating an LED or OLED lighting element including a method for hazard detection.

BACKGROUND OF THE INVENTION

In the operation of an electrical load it may be useful to detect an electrical hazard condition, such as a short circuit or overvoltage condition. For example, an electrical load may include two input terminals, and may be driven by applying a voltage or current between these input terminals. In case of a failure, a short circuit condition may occur between the input terminals, such that the electrical resistance provided by the load between the input terminals drops drastically. This can potentially lead to a hazardous situation due to greatly increased current flow, such as overheating. In particular, hazard detection may be useful for LED lighting elements, quite specifically for organic light emitting diode elements (OLED).

EP 2 456 057 A2, for example, discloses a power converter supplying a driving voltage for the operation of an organic light emitting display device. The power converter includes a voltage conversation unit that provides a first and second driving voltage at a first and second output electrodes. A short detection unit generates a control signal by comparing, during a short detection period, a magnitude of a voltage of the second output electrode to a magnitude of a reference voltage. In response to the control signal, the power converter is configured to shut down, such that when a magnitude of the voltage of the second output electrode is equal to or larger than the magnitude of the reference voltage during the short detection period no further driving voltage is applied.

SUMMARY OF THE INVENTION

It may be considered an object of the present invention to provide an electrical circuit and a method allowing to securely detect a hazard condition even for different types of power supplied to the load.

This object is achieved according to the invention by an electrical circuit according to claim 1, a lighting arrangement according to claim 7, a detection method according to claim 9 and an operating method according to claim 10. Dependent claims refer to preferred embodiments of the invention.

The present inventors have recognized that prior known detection circuits and methods may not be generally useable with different types of power supplies, and in particular not for different ways of controlling/dimming the load. In particular, for an electrical lighting element as a load, such as, for example, a LED lighting element, and specifically for an OLED lighting element, dimming/operation control may be effected by supplying electrical power at the input terminals in a time-variant manner, i.e. modulated, according to, e.g. amplitude modulation or pulse width modulation (PWM). The present inventors have found that specifically for gapped electrical power such as occurring in pulse width modulation, i.e. where none or only very limited electrical power is supplied during periods of time, prior known detection circuits may not operate reliably. Thus, according to one aspect of the invention, a detection circuit and method should safely operate even for gapped power supply, such as during PWM control/dimming.

According to one aspect of the invention, an electrical circuit comprises terminals between which an electrical hazard condition is to be detected. In the present context, an electrical hazard condition may be e.g. a short circuit, an overvoltage, or both. As will become apparent in connection with preferred embodiments, the terminals may be directly electrically connected to the supply terminals of a load. While a series connection is possible, it is preferred to connect the terminals to an electrical power supply in parallel with the load.

According to the invention, the electrical circuit comprises a disabling element connected to at least one of the terminals to disable the load. In a preferred embodiment, the disabling element is a controllable switching element, such as e.g. a transistor, FET, relay or, preferably, a thyristor, and may be connected between the terminals. In case of a series connection to the load, the disabling element may disable the load by opening a switching element, thereby disconnecting the load. Alternatively, in the preferred case of a parallel connection, a controllable switching element between the terminals may disable the load by closing the switching element, thereby bridging the load. Although this will electrically appear for a power supply circuit similar to a short circuit condition, disabling by bridging the load may provide controlled conditions therefor.

According to an aspect of the invention, a monitoring circuit is provided, which is connected and disposed to monitor a voltage or current magnitude at at least one of the terminals. The monitoring circuit is connected to activate the disabling element in case an electrical hazard condition is detected. In particular, a short circuit or an overvoltage condition may be detected e.g. by monitoring a current magnitude and comparing it to a threshold value, where the fact that the monitored current magnitude surpasses the threshold value is indicative of a short circuit condition. Alternatively, and in the preferred case, it is possible to monitor a voltage magnitude at at least one of the terminals to detect an overvoltage condition if the voltage magnitude surpasses an upper threshold or a short circuit condition if the voltage magnitude drops below a lower threshold value.

According to the invention, the monitoring circuit comprises a maximum or minimum value detector to deliver a maximum or minimum value of the monitored magnitude over time. Thus, if the monitored magnitude varies within a given time interval, a maximum value detector will only deliver a maximum value (peak value) assumed by the monitored magnitude within this time interval (such as a minimum value detector will correspondingly deliver the minimum value assumed within this interval).

By obtaining a maximum (or minimum) value over time, rather than monitoring each instantaneous value of the monitored magnitude, the detection circuit and method are well able to be used with time-varying electrical power, and in particular with gapped electrical power. It is in the nature of a short circuit condition that the monitored magnitude reaches an exceptionally low (or exceptionally high) value, indicating the short circuit condition. Therefore, regarding only a maximum (or minimum) value, instead of the instantaneous, variable value will not deteriorate reliable detection of this condition. However, during regular operation with time-varying electrical power, and in particular with gapped electrical power such as during PWM operation, the maximum (or minimum) value will remain relatively stable and unaffected by power variations over time.

Preferably, the maximum (or minimum) value detector for the monitored magnitude operates within a defined time window, i.e. delivers the maximum (or minimum) value of the monitored magnitude within this time window. It is preferable to choose a time window which is longer than expected gaps in the power supply, in particular longer than the longest expected "off"-periods in case of PWM supply. While generally even lower PWM frequencies are possible, an example of an assumed lower limit for the PWM frequency could be e.g. 50 Hz. In this case, it is preferable to choose the time window of the maximum (or minimum) value detector above the associated time period, i.e. above 200 ms. Further preferred, PWM frequencies are higher, such as e.g. 100 Hz or above, such that even time windows of 100 ms or less will be sufficient to deliver a substantially constant maximum (or minimum) value during normal PWM operation.

In a preferred embodiment of the invention, a delay timer circuit is provided within the monitoring circuit, which provides an activation signal if a detection signal is applied for a specified delay time interval. The delay timer preferably accepts as input a detection signal from a comparator circuit, indicating that a monitored voltage or current magnitude has surpassed a specified threshold. The output signal of the delay circuit is preferably an activation signal that may be used to activate the disabling element. The delay timer circuit provides a certain inertia to the detection circuit, such that short transients do not immediately lead to activation of the disabling element.

While a separate power supply for the electrical circuit may be provided, it is preferred to supply the electrical circuit out of the electrical power delivered at at least one of the terminals between which the electrical hazard condition should be detected. In order to ensure reliable operation even for gapped supplies, such as PWM, it is preferred to provide at least one electrical energy storage element connected to one of the terminals to receive and store electrical energy. This electrical energy storage element may be any type of component able to temporally store electrical energy, such as e.g. an inductance, capacitance or a rechargeable battery. Preferably, a single capacitor or capacitor bank comprised of at least two, but preferably more than two capacitors connected in parallel is provided as electrical energy storage element. During periods of time where no electrical energy is supplied at the terminals, e.g. during the "off" periods of PWM supply, components within the monitoring circuit may be supplied with electrical energy stored in the electrical energy storage element. During periods where power is supplied (e.g. during the "on" periods of PWM supply), the electrical energy storage element may be recharged.

In order to monitor the minimum or maximum value of the voltage or current magnitude, it is preferred to provide at least one comparator circuit for comparing this value to a threshold value. In a preferred embodiment, a comparator circuit delivers a detection signal if a maximum value of a monitored voltage is above an upper threshold value and/or below a lower threshold value. In alternative embodiments, a current value may be compared to upper or lower threshold values. Further preferred, the peak value of the monitored magnitude is compared to a normal operation window defined by both an upper and a lower threshold. In this case at least a first comparator circuit and a second comparator circuit may be provided to compare the minimum or maximum value of the voltage or current magnitude both to a lower threshold value and to an upper threshold value. A detection signal may then be generated if the monitored magnitude reaches values outside of a normal operation window defined by the lower and upper thresholds.

While the electrical circuit described above may be separately available and may be applied to different types of electrical loads, it is preferred to provide an electrical lighting element with such an electrical circuit for electrical hazard protection. Specifically a LED lighting element, and in particular an OLED element may thus be protected. For an LED or OLED lighting element comprising driving terminals, it is further preferred to provide the electrical circuit to be connected in parallel to the driving terminals as explained above.

Due to the maximum (or minimum) value detector, as described above, efficient protection may be provided even for gapped electrical power supply. Therefore, in one embodiment of a lighting arrangement, a power supply circuit is provided supplying a pulsed electrical voltage or current to the driving terminals.

BRIEF DESCRIPTION OF THE DRAWINGS

The above and other objects, features and advantages of the present invention will become apparent from and elucidated with reference to the embodiments described hereinafter.

In the Figures

FIG. 4 is a current vs time graph illustrating a gapped electrical power supply which is a regulated current (34) that is time-modulated such that the electrical power is supplied intermittently in a first time interval (36) of constant current amplitude whereas no electrical current is supplied in a second time interval (38) following the first interval.

DETAILED DESCRIPTION OF EMBODIMENTS

Figure 1:
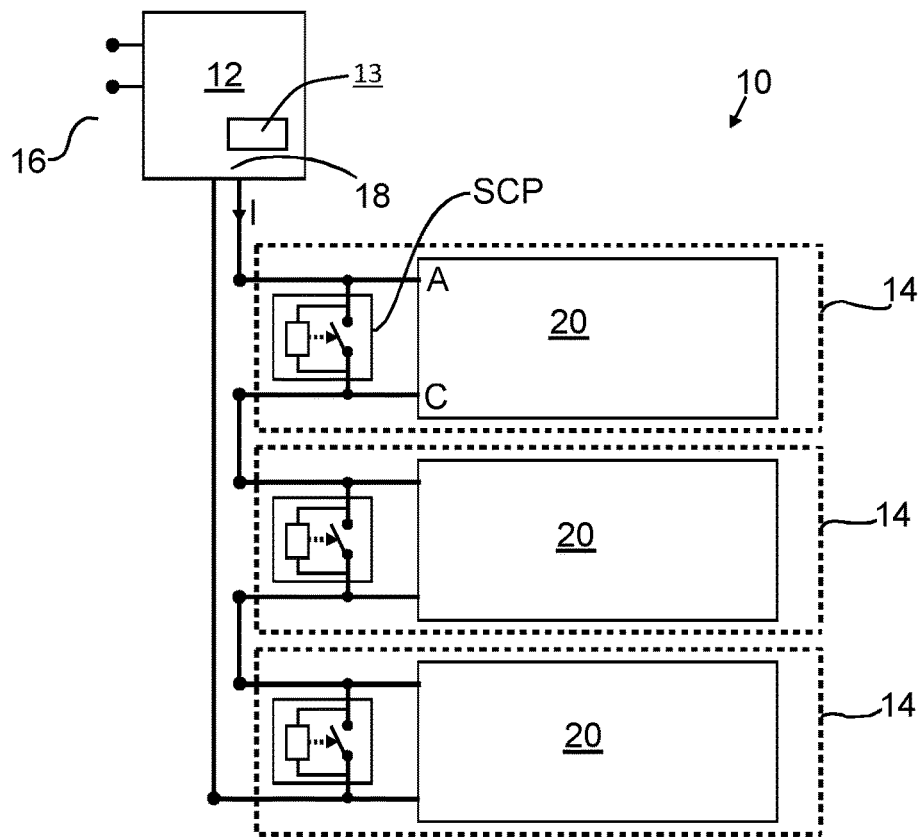
FIG. 1 show a schematic diagram of a lighting arrangement.

FIG. 1 shows in a schematical representation a lighting arrangement 10 comprised of a power supply 12 and, connected thereto, three OLED lighting assemblies 14.

The power supply 12 comprises a mains connector 16 for connection to mains electrical power and a current modulator 13 and delivers at power supply terminals 18 electrical power with voltage and current values adapted to operate the OLED assemblies. Since in the present example the OLED assemblies 14 are intended for lighting purposes, a certain electrical power is necessary to obtain sufficient luminous flux. Generally, it is preferred to use OLED elements 20 with a nominal electrical power of at least 1 W, further preferred at least 3 W. For example, one type of OLED assembly may be operated at nominal values of 14V and 500 mA, thus has a nominal power of 7 W.

The electrical power supply 12 may be any type of power supply delivering a regulated voltage or current at the terminals 18 via the current modulator 13. Preferably, power supply 12 is one out of a plurality of known power supply circuits to deliver a regulated constant-current supply to the OLED assemblies 14. As will become apparent, electrical power and therefore luminous flux may be controlled by modulating the current I supplied to the OLED assemblies 14 over time, in particular by AM (amplitude modulation) or PWM (pulse width modulation) control.

The OLED assemblies 14 each comprise an OLED lighting element 20, i.e. a flat surface with an OLED covering electrically connected to form (between an anode connection A and cathode connection C) an organic light emitting diode surface. Since OLED technology is generally known to the skilled person, and the invention is not limited to a specific type thereof, further details will not be explained here The OLED lighting assemblies are, as shown in FIG. 1, connected in series to the terminals 18 of power supply 12. In order to operate each OLED assembly 14, the power supply 12 supplies a regulated current I, which may e.g. have a value of 500 mA or 300 mA and will be supplied to all three OLED assemblies 14 due to the series connection.

In order to control operation of the OLED assemblies 14, the regulated current I may be delivered time-modulated, and in particular with pulse-width modulation (PWM), i.e. such that electrical power is supplied intermittently in first intervals of constant current amplitude (pulses), preferably at the nominal current of the OLED element, whereas no electrical current is supplied in second time intervals following the first intervals. In operation, control of the luminous flux by each OLED assembly 14 may be effected by appropriately choosing the duty cycle, i.e. the duration of the first intervals ("on") relative to the duration of the second intervals ("off").

Within the surfaces of the OLED element 20 of each OLED assembly 14, it is possible that certain defects may lead to electrical hazard conditions. For example, local defects within the surface area may cause a local drop of resistance, i.e. a short circuit condition. In consequence, during operation an increased amount of heat is generated at the position of the defect, which may lead to strong overheating and could potentially become a fire hazard. Likewise, if the surface area deteriorates over the lifetime of the OLED element 20 or due to mechanical effects, such that the resistance increases, operation with a regulated current I may lead to a strongly increased driving voltage applied, causing overvoltage as a further potential electrical hazard situation.

In order to supervise the operation of the OLED element 20 and to prevent hazards such as e.g. overvoltage or overheating in case of short circuit conditions occurring, each OLED assembly 14 comprises an electrical hazard protection circuit SCP connected in parallel to the OLED element 20.

Figure 2:
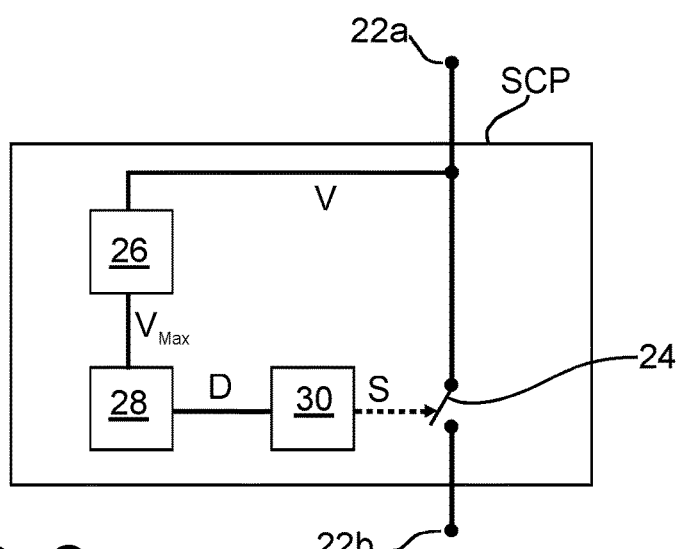
FIG. 2 shows a schematic diagram of an electrical hazard protection device within the lighting arrangement of FIG. 1.

FIG. 2 shows in a schematic representation elements of a short circuit protection circuit SCP. Each SCP comprises terminals 22a, 22b by which the SCP is connected in parallel to an OLED element 20 (FIG. 1), and between which terminals 22a, 22b an electrical hazard condition should be detected.

Within each SCP, a disabling switch 24 is provided as a disabling element, which is connected between the terminals 22a, 22b such that if the disabling switch 24 is closed the terminals 22 are directly connected to each other. In this case, the connected OLED element 20 is bridged, such that a current delivered at the terminals 18 of the power supply 12 will flow mainly through the terminals 22a, 22b and the disabling switch 24, bypassing the OLED element 20.

In normal operation the disabling switch 24 is opened such that the current I delivered passes through the OLED element 20 and operates it to emit light.

Within each SCP, the first terminal 22a is connected to a maximum voltage value detector, or peak detector 26. This element accepts as input the time-varying value of the voltage V at the first terminal 22a and delivers as output a maximum value $V_{max}$ thereof. The maximum voltage value detector 26 may thereby operate with a certain time constant, i.e. the delivered maximum voltage value $V_{max}$ may then correspond to the maximum value delivered within a chosen time interval of e.g. 300 ms.

The maximum voltage value $V_{max}$ is processed by a threshold comparator 28, comparing it to a pre-stored voltage threshold value $V_{th}$. The threshold value $V_{th}$ may be an an upper threshold to detect an overvoltage condition. In a case where the delivered maximum voltage value $V_{max}$ is found to be above the upper threshold $V_{th}$, a detection signal D is delivered to a delay circuit 30 to signal an electrical hazard condition. Alternatively, the threshold value $V_{th}$ may be a lower threshold, such that a detection signal D signaling a short circuit condition is delivered in case $V_{max}$ drops below $V_{th}$.

During normal operation, if no electrical hazard condition is detected, the detection signal D is inactive.

Delay circuit 30 operates with a certain pre-defined time constant of e.g. 0.5 to 3 s and delivers a control signal S if the detection signal D is supplied for this pre-chosen length of time. As long as the detection signal is inactive or has only been active for less than the time constant, no control signal S is applied. This serves to avoid false alarms, in particular during a run-up phase of current control.

The control signal S operates the disabling switch 24, i.e. if the control signal S is present because the detection signal D has been applied to delay circuit 30 for the specified length of time, the disabling switch 24 is closed.

In operation of each of the OLED assemblies 14, the SCP thus operates as follows: In normal operation, the disabling switch 24 is opened. The current I flows through the OLED elements 20. Consequently, the voltage at the first terminal 22a of each SCP will be at an expected nominal value. Thus, comparator circuit 28 will deliver a value $V_{max}$ within a normal voltage window, i.e. below an upper threshold $V_{th1}$ and above a lower threshold $V_{th2}$ and no detection signal D will be applied, such that disabling switch 24 will remain open.

In case of a short circuit condition occurring at an OLED element 20, the voltage at the first terminal 22a will drop, such that (after the time interval associated with the maximum voltage value detector 26) correspondingly also the maximum voltage value $V_{max}$ delivered by the maximum voltage detector circuit 26 will decrease. Eventually comparator circuit 28 will find $V_{max}<V_{th2}$ and deliver the detection signal D. After a period of time pre-set in delay circuit 30, this will lead to activation of the control signal S, thereby closing the disabling element 24 and thus bypassing the defective OLED element 20. Likewise, in case of an increase of resistance in the OLED element 20, the voltage V and thus the maximum voltage value $V_{max}$ will increase, until at $V_{max}>V_{th1}$ the detection signal D for an overvoltage condition will be activated, leading—after the delay time— to activation of the disabling element 24.

This behavior of each SCP is independent of the mode in which electrical power is supplied, i.e. operation is the same, regardless whether the electrical current delivered may be constant, amplitude modulated or pulse-width modulated. In each case, maximum voltage detection circuit 26 will deliver the maximum voltage value $V_{max}$. For example, in a case of regular operation at constant current (and consequently voltage), the maximum voltage detector 26 will also deliver a constant value $V_{max}$. Likewise, in operation in PWM mode, maximum voltage detection circuit 26 will continue to deliver the constant value $V_{max}$ even during the off-periods, as long as the time constant of the peak detector circuit 26 is longer than the "off"-period of the PWM voltage.

In cases of a short circuit condition, the voltage value at the first terminal 22a will strongly decrease, whereas it will increase in an overvoltage condition, regardless of the mode of supply of electrical power. Thus, each OLED assembly 14 equipped with an SCP as described is secured against electrical hazard conditions occurring within the OLED element 20, regardless of how electrical power is supplied. The OLED assemblies 14 may thus be safely operated by different kinds of power supplies 12.

Figure 3:
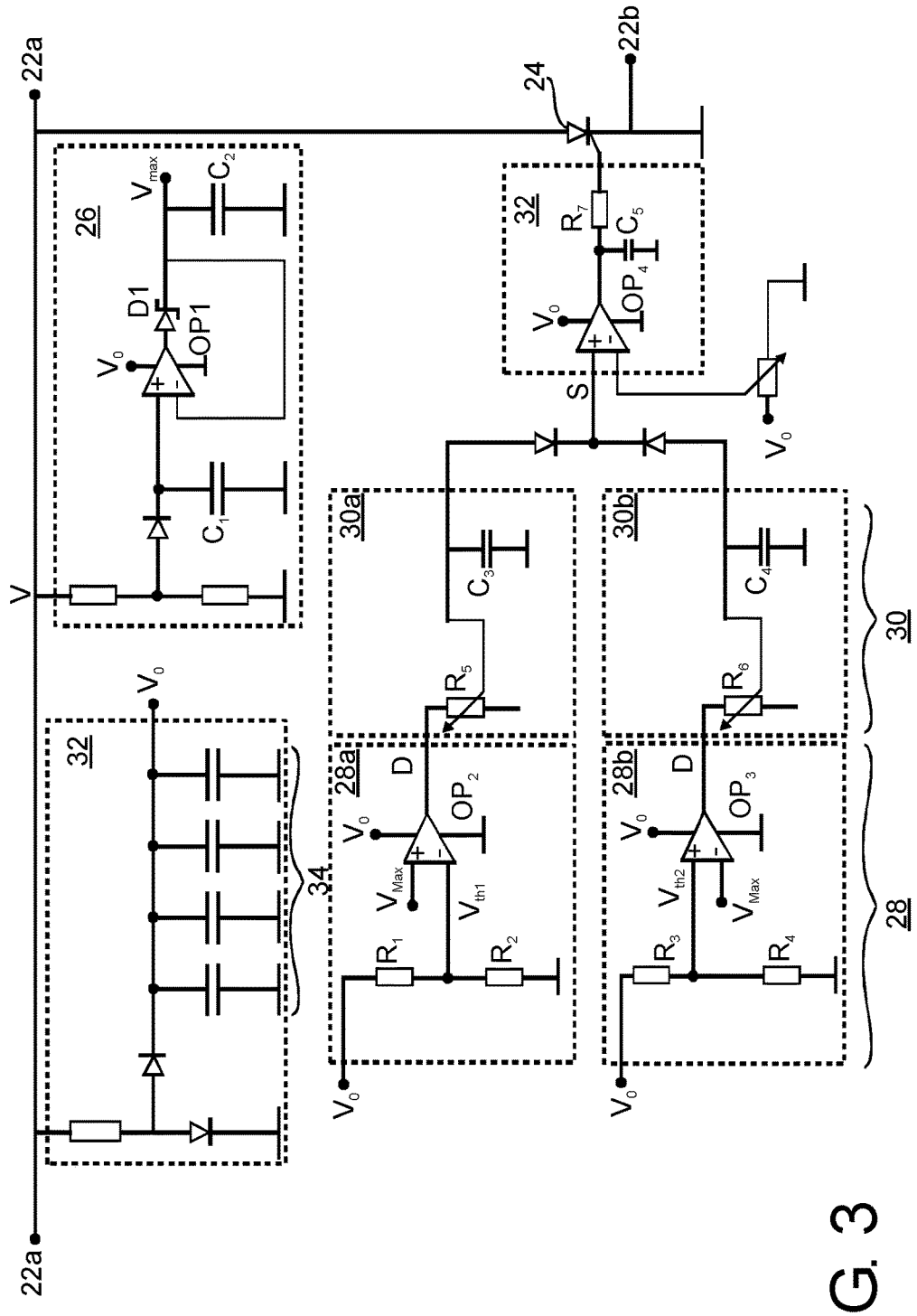
FIG. 3 shows an embodiment of circuit diagram for the protection device of FIG. 2.

FIG. 3 shows a circuit diagram of an embodiment of an SCP circuit, including terminals 22a and 22b. An energy storage circuit 32 is connected to the first terminal 22a, which includes a capacitor bank 34. In PWM operation, capacitor bank 34 is charged during each pulse and delivers an operating voltage $V_O$ for the active components of the SCP circuit.

Further, the SCP circuit comprises a maximum voltage detector 26 (peak voltage detector circuit) connected to the first terminal 22a. The voltage V delivered at the first terminal 22a is stabilized at a first capacitor C1 and delivered to a first operational amplifier OP1, which is coupled back over a Zener diode D1. The output corresponds to a maximum voltage $V_{max}$, stabilized over a second capacitor C2. As the skilled person will notice, within the peak voltage detector circuit 26 the voltage V is not directly applied to the operational amplifier OP1, but only a certain proportion thereof given by a voltage divider, because the operating input window of OP1 is limited by the supply voltage. Further, the skilled person understands that the peak detector circuit will operate within a time window defined by the values of $C_1$ and $C_2$, i.e. if the input voltage V drops below a previous value $V_{max}$ for longer than the time window, the delivered peak value $V_{max}$ will also decrease.

The delivered maximum voltage over time $V_{max}$ is delivered to a comparator circuit 28 comprised of a first comparator circuit 28a for an upper threshold and second comparator circuit 28b for a second, lower threshold. Each of the comparator circuits 28a, 28b are built substantially identically, except for connection of the respective comparator. In the first comparator circuit 28a, the maximum voltage $V_{max}$ is delivered to the positive input of an operational amplifier OP2 used as a comparator, with the operating voltage $V_O$ delivered over a voltage divider R1/R2 to the negative input of the comparator OP2 as upper threshold $V_{th1}$. Likewise, in the second comparator circuit 28b, the maximum voltage $V_{max}$ is delivered to the negative input of an operational amplifier OP3, and the operating voltage V0 is delivered over a voltage divider R3/R4 as a lower threshold value $V_{th2}$ to the negative input of the comparator OP3. By the value of R1/R2, the first, upper threshold $V_{th1}$ may be set in the upper threshold comparator circuit 28a, whereas by choosing the corresponding values of resistors R3/R4 in the second, lower threshold comparator circuit 28b the lower threshold value $V_{th2}$ may be chosen.

In each comparator circuit 28a, 28b, the output of the comparators OP2, OP3 is delivered as a detection signal D if $V_{max}$ is outside of the normal operation window, i.e. above $V_{th1}$ or below $V_{th2}$.

The detection signal D does not instantaneously lead to activation of a disabling element, but is first processed by a delay circuit 30 comprised of individual delay circuits 30a, 30b. Each delay circuit 30a, 30b is an R/C circuit comprised of an adjustable resistor R5 (R6) and capacitor C3 (C4).

Thus, the delay/driver circuit 30 accepts as input the detection signals D from both comparator circuits 28a, 28b, indicating that the delivered maximum voltage value $V_{max}$ is outside of the normal operation window defined by the upper and lower threshold voltages $V_{th1}$, $V_{th2}$. If the detection signal D is present for the amount of time specified by the R/C-circuits 30a, 30b, which may be chosen by the resistance values R5, R6 and the capacitance values C3, C4, a control signal S is generated and supplied to a driver circuit 32.

In case of a presence of a control signal S, a further operational amplifier OP4 of a driver circuit 32 drives over an RC circuit comprised of a capacitor C5 and a resistor R7 a thyristor 24 working as the disabling switch, and being connected between the first and second terminals 22a, 22b.

Thus, if a peak $V_{max}$ of the voltage V, detected by the peak voltage detector circuit 26 is found to be above the upper threshold $V_{th1}$, or below the lower threshold $V_{th2}$ for the amount of time given by the time constants of the delay circuit 30, the disabling switch 24 is activated and bridges the load connected between terminals 22a, 22b.

The invention has been illustrated and described in detail in the drawings and foregoing description. Such illustration and description are to be considered illustrative or exemplary and not restrictive; the invention is not limited to the disclosed embodiments.

For example, instead of monitoring the voltage at the first terminal 22a, it is also possible to monitor another electrical value, such as a voltage at the second terminal 22b or a current value.

Other variations to the disclosed embodiments can be understood and effected by those skilled in the art in practising the claimed invention, from the study of the drawings, the description and the appended claims. In the claims, the word "comprising" does not exclude other elements or steps, and the indefinite article "a" or "an" does not exclude a plurality. A single unit may fulfill the function of several items recited in the claims. The mere fact that certain measures are recited in mutually different depended claims does not indicate that a combination of these measures cannot be used to advantage. Any references signs in the claims should not be construed as limiting the scope.

The invention claimed is:

1. An electrical circuit for detection of a short circuit or overvoltage or both condition(s) of a load, comprising:
  a power source delivering a gapped electrical power supply which is a regulated current that is time-modulated such that the electrical power is supplied intermittently in a first time interval of constant current amplitude whereas no electrical current is supplied in a second time interval following the first interval,
  terminals for said load between which the short circuit or overvoltage or both condition(s) are to be detected,
  a disabling element connected to at least one of said terminals to disable said load, a monitoring circuit connected to monitor a voltage or current magnitude at least one of said terminals to detect the short circuit or overvoltage or both condition(s), said monitoring circuit comprising a maximum or minimum value detector to deliver a maximum or minimum value of said voltage or current magnitude over a time at least longer than the second time interval in the power supply, such that said monitoring circuit is disposed to monitor said maximum or minimum value over the time to detect the short circuit or overvoltage or both condition(s), and wherein said monitoring circuit is connected to activate said disabling element when the short circuit or overvoltage or both condition(s) are detected.

2. The electrical circuit according to claim 1, where said disabling element is a controllable switching element connected between said terminals, and said monitoring circuit is connected to close said switching element if the short circuit or overvoltage or both condition(s) are detected.

3. The electrical circuit according to claim 1, where said monitoring circuit further comprises a delay timer circuit for providing an activation signal when a detection signal is applied to said delay timer circuit for a delay time interval, and said delay timer circuit is connected to supply said activation signal to said disabling element.

4. The electrical circuit according to claim 1, where at least one electrical energy storage element is connected to at least one of said terminals to receive and store electrical energy, and where at least said monitoring circuit is connected to be supplied with electrical energy from said electrical energy storage element when no electrical energy is supplied at said terminals.

5. The electrical circuit according to claim 1, where said monitoring circuit comprises at least a comparator circuit to compare said maximum or minimum value of said voltage or current magnitude over time at least longer than the second time interval to a threshold value.

6. The electrical circuit according to claim 5, where said monitoring circuit comprises at least a first comparator circuit to compare said maximum or minimum value of said voltage or current magnitude over time at least longer than the second time interval to a lower threshold value and a second comparator circuit to compare said maximum or minimum value of said voltage or current magnitude over time at least longer than the second time interval to an upper threshold value.

7. A lighting arrangement including at least one LED or OLED lighting element comprising driving terminals and an electrical circuit according to claim 1 connected in parallel to said driving terminals.

8. The electrical circuit of claim 1 where the time modulated current of the gapped electrical power supply from the power source is modulated by pulse width modulation (PWM).

9. The electrical circuit of claim 1 where the load is an OLED device.

10. A method of detection of a short circuit or overvoltage or both condition(s) between terminals of a load in an electrical circuit, comprising the steps of:

providing a power source delivering a gapped electrical power supply which is a regulated current that is time-modulated such that the electrical power is supplied intermittently in a first time interval of constant current amplitude whereas no electrical current is supplied in a second time interval following the first intervals, monitoring a voltage or current magnitude at least one of said terminals and controlling a disabling element connected to at least one of said terminals to disable said load in case of the short circuit or overvoltage or both condition(s), wherein said monitoring step includes detecting a maximum or minimum value of said voltage or current magnitude over a time at least longer than the second interval in the power supply, and monitoring said maximum or minimum value to detect the short circuit or overvoltage or both condition(s) over the time, and activating said disabling element when the short circuit or overvoltage or both condition(s) are detected.

* * * * *